US011395400B2

United States Patent
Ku et al.

(10) Patent No.: US 11,395,400 B2
(45) Date of Patent: Jul. 19, 2022

(54) DISPLAY DEVICE HAVING FRONT PANEL LAMINATE

(71) Applicant: E Ink Holdings Inc., Hsinchu (TW)

(72) Inventors: Yu-Ting Ku, Hsinchu (TW); Tzu-Yu Cheng, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 112 days.

(21) Appl. No.: 16/910,056

(22) Filed: Jun. 23, 2020

(65) Prior Publication Data

US 2021/0029820 A1 Jan. 28, 2021

(30) Foreign Application Priority Data

Jul. 23, 2019 (TW) .................................. 108126044

(51) Int. Cl.
*H05K 1/02* (2006.01)
*H05K 5/00* (2006.01)
*H05K 1/14* (2006.01)

(52) U.S. Cl.
CPC .............. *H05K 1/0213* (2013.01); *H05K 1/14* (2013.01); *H05K 5/0017* (2013.01)

(58) Field of Classification Search
CPC ...... G02F 1/167; H05K 3/284; H05K 1/0213; H05K 1/14; H05K 5/0017; H05B 33/04
See application file for complete search history.

(56) References Cited

U.S. PATENT DOCUMENTS

| 8,982,575 | B2* | 3/2015 | Lai | ................. G02F 1/13452 |
| | | | | 361/771 |
| 9,791,753 | B2* | 10/2017 | Chiang | ................. H05K 3/28 |
| 2016/0205781 | A1 | 7/2016 | Chan | |

FOREIGN PATENT DOCUMENTS

| CN | 102855816 A | 1/2013 |
| CN | 104238178 A | 12/2014 |
| CN | 205231068 U | 5/2016 |
| CN | 110164302 A | 8/2019 |
| TW | 201322440 A | 6/2013 |
| TW | 201624223 A | 7/2016 |
| TW | I659679 B | 5/2019 |

OTHER PUBLICATIONS

Corresponding Taiwan office action dated May 29, 2020.
Corresponding Chinese office action dated Jan. 20, 2022.

* cited by examiner

*Primary Examiner* — James Wu
(74) *Attorney, Agent, or Firm* — CKC & Partners Co., LLC

(57) ABSTRACT

A display device includes a driving substrate, a front panel laminate, a circuit board, a front protective layer, and a glue. The front panel laminate is disposed on the driving substrate and includes a display medium layer. The circuit board is disposed on an end of the driving substrate. The front protective layer is disposed on the front panel laminate. The front protective layer has a notch. An end of the circuit board is in the notch. The end of the circuit board and the front protective layer have a first gap therebetween. The glue is filled in the first gap. A normal projection of the glue on the driving substrate overlaps a normal projection of the circuit board on the driving substrate and overlaps a normal projection of the front protective layer on the driving substrate.

9 Claims, 6 Drawing Sheets

DISPLAY DEVICE HAVING FRONT PANEL LAMINATE

CROSS-REFERENCE TO RELATED APPLICATION

This application claims priority to Taiwan Application Serial Number 108126044, filed Jul. 23, 2019, which is herein incorporated by reference in its entirety.

BACKGROUND

Field of Invention

The present invention relates to a display device.

Description of Related Art

As portable electrical products become increasingly popular, flexible displays (e.g., e-paper, e-book) have drawn the attention of large markets gradually. In modern technology, flexible displays are formed from a driving substrate, a display module and an external circuit (e.g., flexible circuit board) disposed on the driving substrate. The flexible display has a display area and a board area. The external circuit is disposed on the board area.

FIG. 1 is a top view of a flexible display device according to the prior art. Reference is made to FIG. 1. The flexible display 1 according to the prior art includes a top protective sheet 12, a driving substrate 14, a circuit board 16, a display module (not shown), and a driving chip (not shown). Generally, to protect the flexible display 1, the top protective sheet 12 is attached on a front face of the flexible display 1. However, the circuit board 16 is jointed at the front face of the flexible display 1 such that the board area of the flexible display is stepped. When the top protective sheet 12 is attached thereon, an air strip 18 may be formed between the top protective sheet 12, the driving substrate 14, and the circuit board 16. As a result, moisture may infiltrate the flexible display 1 by the air strip 18, influencing the circuits and devices in the flexible display 1.

SUMMARY

The present invention provides a display device including a glue disposed between a circuit board and a front protective layer such that ambient moisture is prevented from entering a first gap between the circuit board and the front protective layer.

The present disclosure provides a display device including a driving substrate, a front panel laminate, a circuit board, a front protective layer, and a glue. The front panel laminate is disposed on the driving substrate and includes a display medium layer. The circuit board is disposed on an end of the driving substrate. The front protective layer is disposed on the front panel laminate. The front protective layer has a notch. An end of the circuit board is in the notch. The end of the circuit board and the front protective layer have a first gap therebetween. The glue is filled in the first gap. A normal projection of the glue on the driving substrate overlaps a normal projection of the circuit board on the driving substrate and overlaps a normal projection of the front protective layer on the driving substrate.

In some embodiments of the present disclosure, the front protective layer has a first edge, a second edge, and a third edge defining the notch. The second edge and the third edge adjoin two ends of the first edge. The first gap has a first portion between the first edge and the circuit board. The first portion of the first gap is in a range from 0.01 cm to 0.1 cm.

In some embodiments of the present disclosure, the first gap has a second portion between the second edge and the circuit board. The second portion of the first gap is in a range from 0.01 cm to 0.1 cm.

In some embodiments of the present disclosure, the first gap has a third portion between the third edge and the circuit board. The third portion of the first gap is in a range from 0.01 cm to 0.1 cm.

In some embodiments of the present disclosure, the glue includes an extension portion. The extension portion extends from the first edge, the second edge, or the third edge of the front protective layer to cover a top surface of the front protective layer.

In some embodiments of the present disclosure, the front protective layer is between the extension portion of the glue and the driving substrate.

In some embodiments of the present disclosure, a normal projection of the circuit board on the driving substrate does not overlap a normal projection of the front protective layer on the driving substrate.

In some embodiments of the present disclosure, the glue includes a main body portion. The circuit board is between the main body portion and the driving substrate.

In some embodiments of the present disclosure, the glue is a UV curable adhesive, a thermal curable adhesive, or a combination thereof.

In some embodiments of the present disclosure, the display device of claim further includes a chip. The front protective layer has an opening, the chip is disposed on the driving substrate exposed by the opening. The opening and the chip have a second gap therebetween. The glue fills in the second gap. The opening and the notch are spaced apart.

In some embodiments of the present disclosure, the glue extends from a top surface of the front protective layer to partially cover the chip.

Based on the discussion above, the display device according to the embodiments of the disclosure allows the circuit board and the front protective layer have the first gap therebetween by disposing the circuit board in the notch of the front protective layer. In particular, the glue fills the first gap. The normal projection of the glue on the driving substrate overlaps a normal projection of the circuit board on the driving substrate and overlaps a normal projection of the front protective layer on the driving substrate. Therefore, ambient moisture is prevented from entering the first gap on the driving substrate between the circuit board and the front protective layer.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
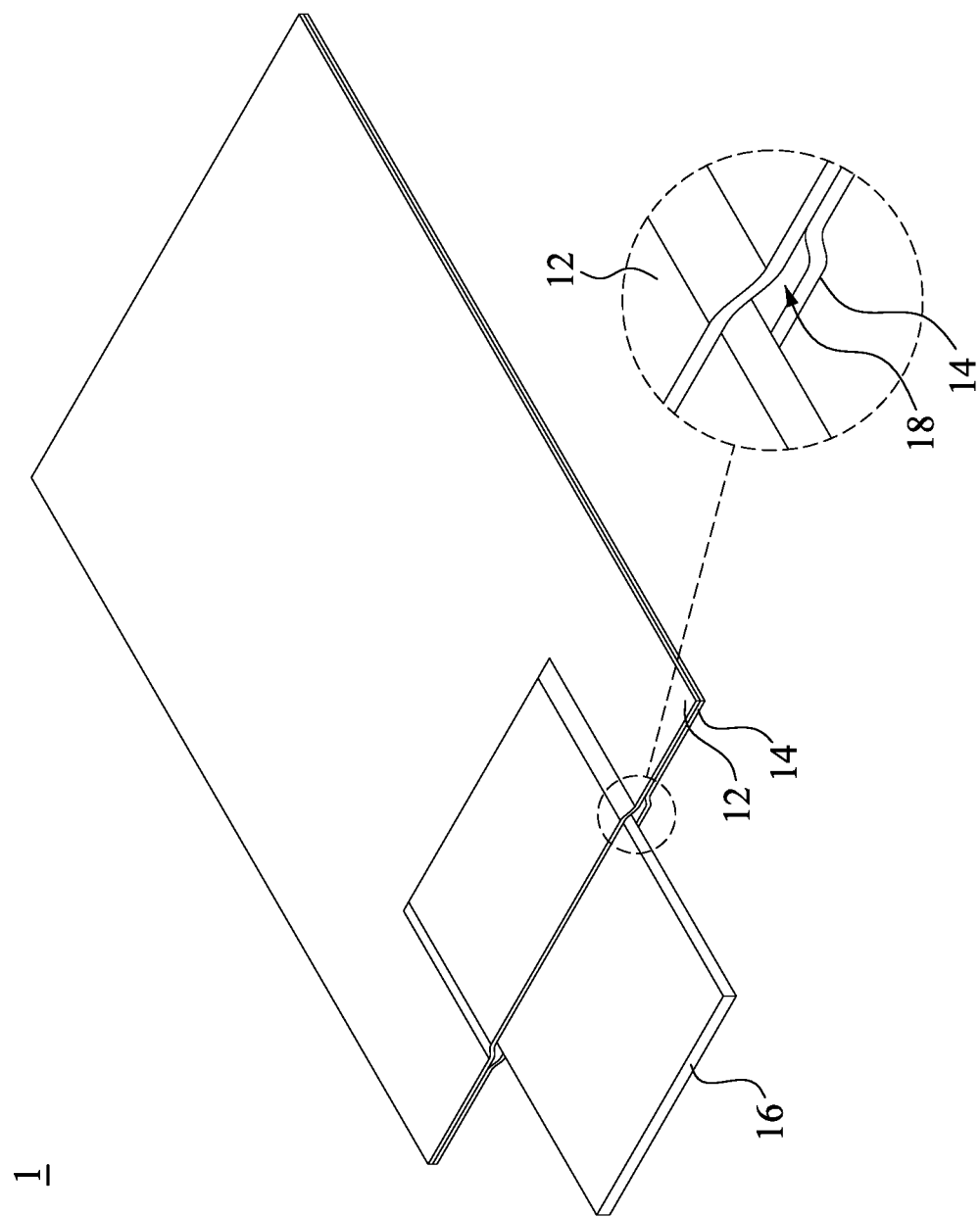
FIG. 1 is a top view of a flexible display device according to the prior art.

Reference will now be made in detail to the present embodiments of the invention, examples of which are illustrated in the accompanying drawings. Wherever possible, the same reference numbers are used in the drawings and the description to refer to the same or like parts.

Figure 2:
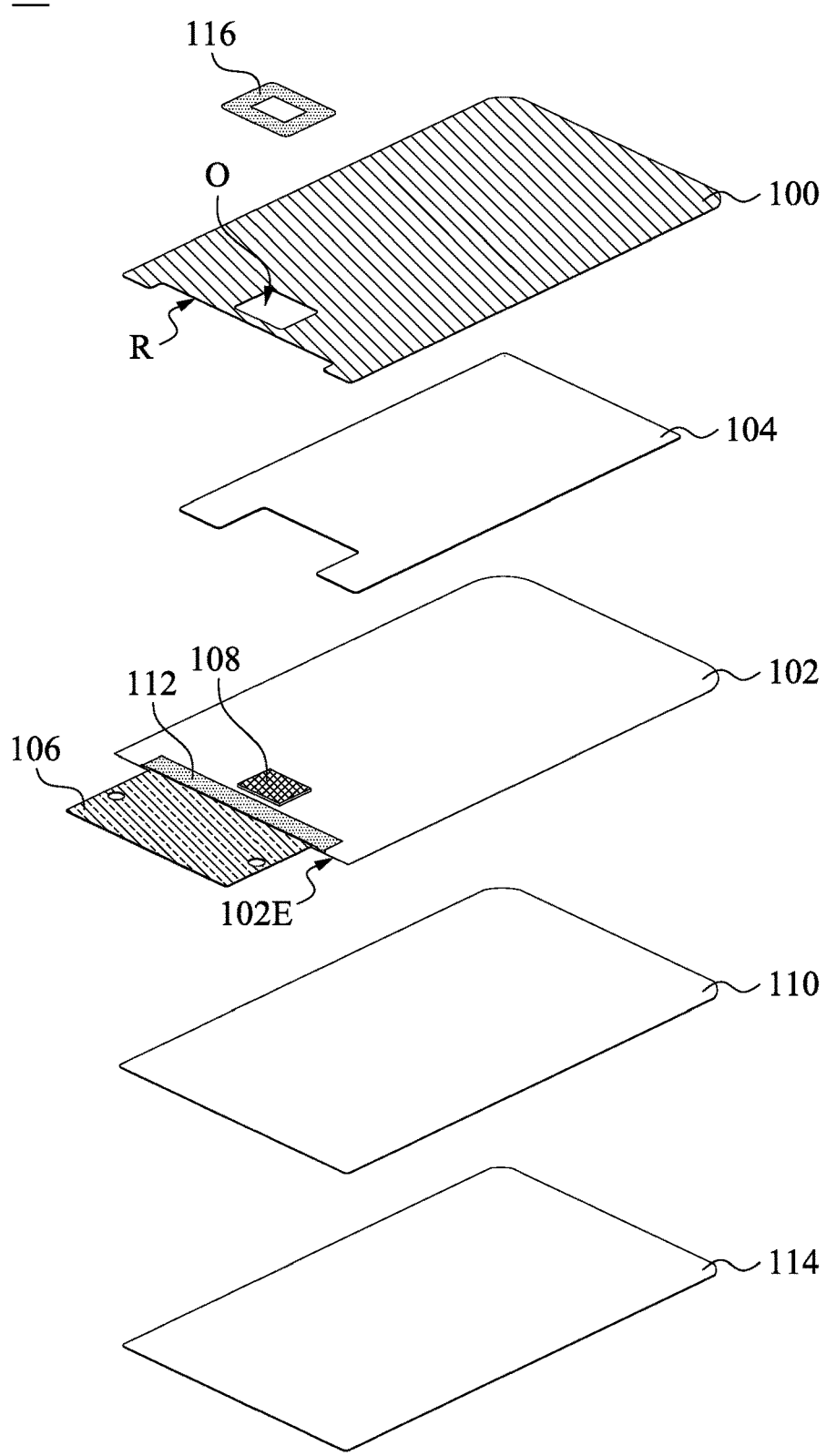
FIG. 2 is an exploded perspective view of a display device according to an embodiment of the present disclosure.
Figure 3:
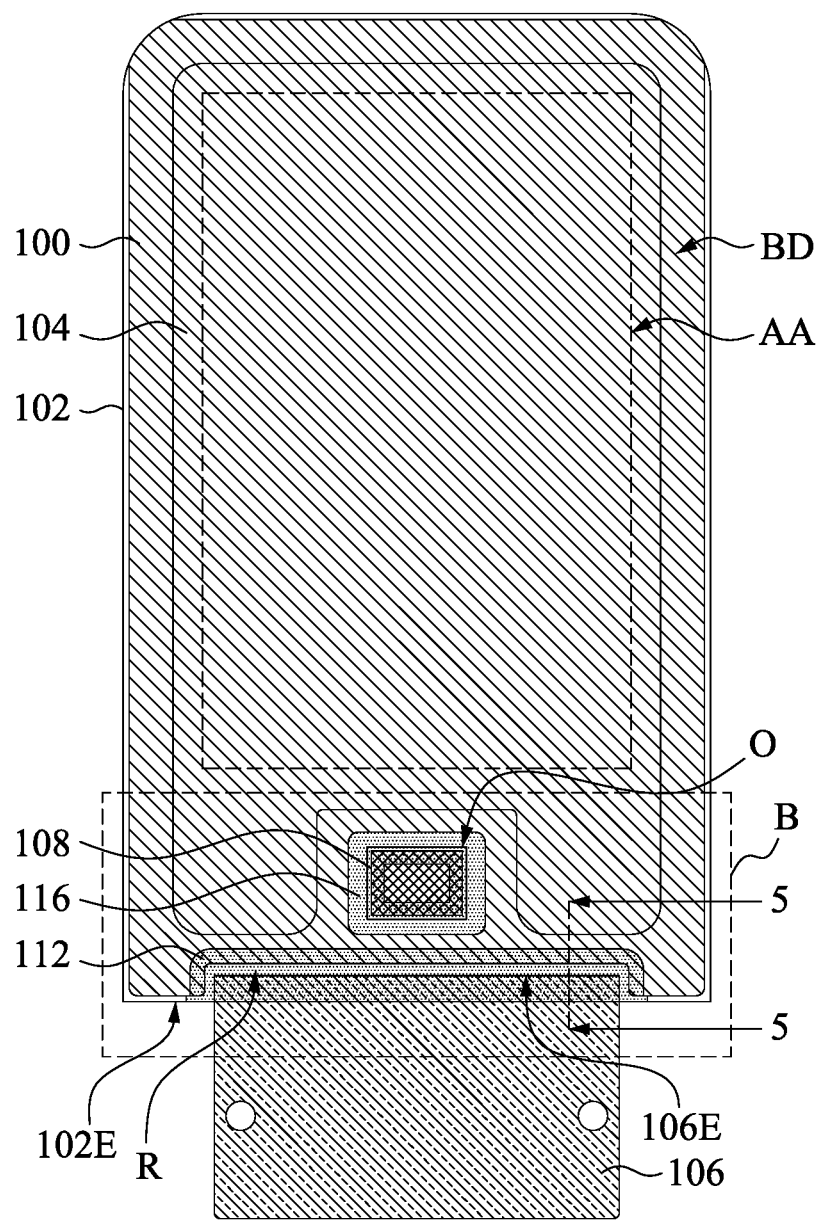
FIG. 3 is a top and assembled view of the display device in FIG. 2.

FIG. 2 is an exploded perspective view of a display device 10 according to an embodiment of the present disclosure. FIG. 3 is a top and assembled view of the display device 10 in FIG. 2. Reference is made to FIGS. 2 and 3. The display device 10 includes a display area AA and a package area BD surrounding the display area AA. The display device 10 includes a front protective layer 100, a driving substrate 102, a front panel laminate 104, a circuit board 106, a chip 108, a back protective layer 110, a first glue 112, and a second glue 116. The front panel laminate 104 is disposed on the driving substrate 102. The circuit board 106 is disposed on the package area BD and is disposed on an end 102E of the driving substrate 102. The circuit board 106 can be connected to the end 102E of the driving substrate 102 by an anisotropic conductive film (ACF). The front protective layer 100 is disposed on the front panel laminate 104 and the driving substrate 102 and is in contact with the front panel laminate 104 and the driving substrate 102. The back protective layer 110 is disposed on a bottom surface of the driving substrate 102 and in contact with the driving substrate 102. The front protective layer 100 and the back protective layer 110 can enhance a structural strength of the display device 10. For example, the front protective layer 100 and the back protective layer 110 may be polyethylene terephthalate (PET). In the present embodiment, the display device 10 can be, but is not limited to, an electrophoretic Display (EPD), liquid crystal display (LCD), electrowetting display (EWD), or organic light emitting diode (OLED) display. In the present embodiment, the display device 10 further includes a mask film 114 disposed on a back surface of the back protective layer 110.

The driving substrate 102 may include a flexible substrate and a pixel electrode thereon. In an embodiment, a material of the flexible substrate may be an flexible material, for example, polyimide (PI), polycarbonate (PC), polyethersulfone (PES), polyacrylate (PA), polynorbornene (PNB), polyethylene terephthalate (PET), polyetheretherketone (PEEK), polyethylene naphthalate (PEN), or polyetherimide (PEI).

The front protective layer 100 includes an opening O. The opening O and a notch R are spaced apart. The chip 108 is disposed on the driving substrate 102 exposed by the opening O. The chip 108 and the opening O have a second gap X therebetween (see FIG. 4). The second glue 116 fills in the second gap X. In the present embodiment, the second glue 116 is annular. For example, the second glue 116 extends from a top surface of the front protective layer 100 to partially cover the chip 108. That is to say, a normal projection of the second glue 116 on the driving substrate 102 partially overlaps a normal projection of the chip 108 on the driving substrate 102. In particular, a normal projection of the second glue 116 on the driving substrate 102 partially overlaps a normal projection of the front protective layer 100 on the driving substrate 102. Therefore, ambient moisture is prevented from entering the second gap X to have disadvantageous effect on the chip 108. In the present embodiment, the chip 108 is in direct contact with the driving substrate 102. Such configuration is referred to as chip on film (COF). However, embodiments of the present disclosure are not limited to. The chip 108 may be a driving chip and is electrically connected to the pixel electrode layer to drive the pixel electrode layer. The circuit board 106 is configured to electrically connect the chip 108 to an external circuit such that the chip 108 can receive signal and the power from the external electrical apparatus by the circuit board 106. The circuit board 106 may be, but is not limited to, a flexible printed circuit (FPC).

In an embodiment, the front panel laminate 104 may include a display medium layer and a common electrode layer on the display medium layer. In some other embodiments, the front panel laminate 104 may include organic light-emitting layers. Depending on driving signals (e.g., an electrical field) of the pixel electrode layer (not shown), the display medium layer varies each gray levels of an display image of the display device 10. For example, the display medium layer may be, but is not limited to, an electrophoresis material having a package structure of microcapsules or microcups. Depending on different design requirements, the display device 10 can include other layers or devices, for example, touch sensing devices. In addition, the display device 10 can further include a color filter layer (not illustrated) to realize a full color display. However, embodiments of the present disclosure are not limited to. Methods of realizing the full color display may utilize display materials with colors. For example, while utilizing the electrophoresis material as the display medium layer, the display medium layer includes a fluid and particles distributed in the fluid. Therefore, full color display can be realized by selecting colored particles or colored fluid.

Figure 4:
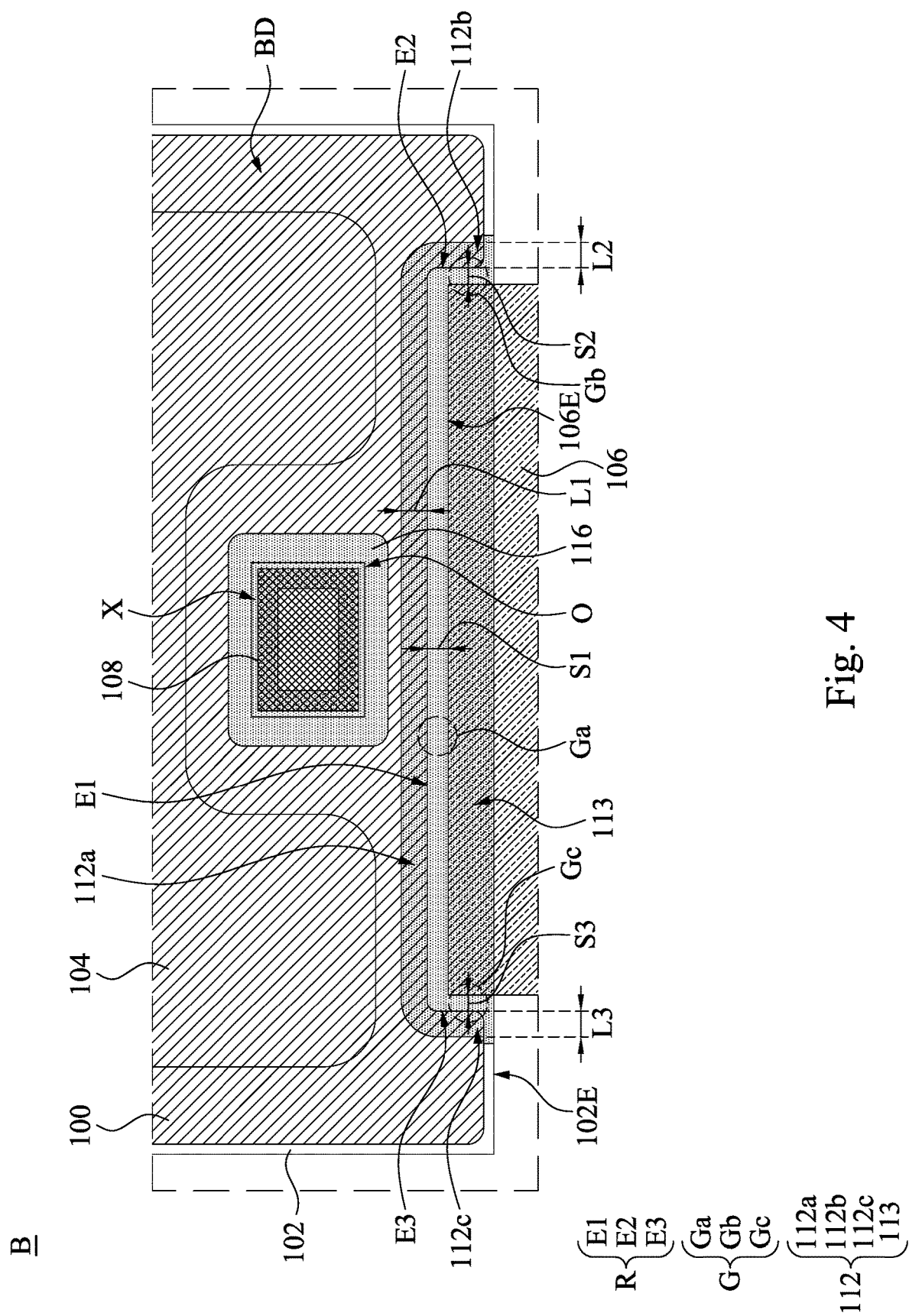
FIG. 4 is an enlarged view of a region B in FIG. 3.
Figure 5:
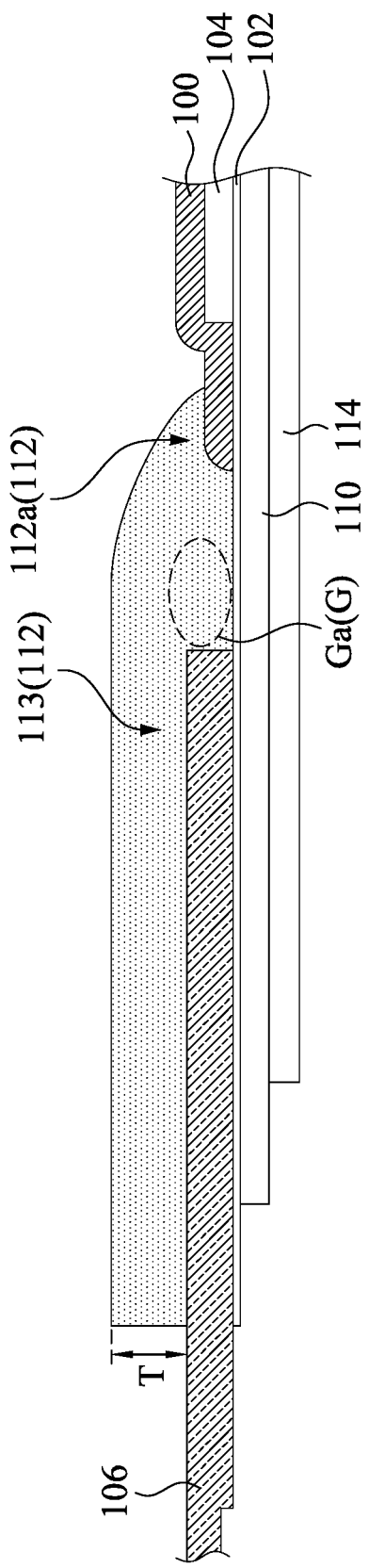
FIG. 5 is a cross-sectional view of the display device taken along line 5-5 in FIG. 3.

FIG. 4 is an enlarged view of a region B in FIG. 3. FIG. 5 is a cross-sectional view of the display device 10 taken along line 5-5 in FIG. 3. Reference is made to FIGS. 4 and 5. In one embodiment, the front protective layer 100 includes a notch R. The circuit board 106 has an end 106E in the notch R. The end 106E of the circuit board 106 and the front protective layer 100 have a first gap G therebetween. In other words, a normal projection of the circuit board 106 on the driving substrate 102 does not overlap a normal projection of the front protective layer 100 on the driving substrate 102. The first glue 112 fills in the first gap G. And a normal projection of the first glue 112 on the driving substrate 102 overlaps a normal projection of the circuit board 106 on the driving substrate 102 and overlaps a normal projection of the front protective layer on the driving substrate 102. Therefore, ambient moisture can be prevented from entering the first gap G on the driving substrate 102 between the circuit board 106 and the front protective layer 100. In other words, ambient moisture can be prevented from entering the display device 10 from the package area BD. The reliability of the display device 10 can be increased. In the present embodiment, methods of forming the notch R of the front protective layer 100 can be, but is not limited to, mechanical cutting (e.g., punching). In other embodiments, methods of forming the notch R of the front protective layer 100 can be laser cutting.

Materials of the first glue 112 and the second glue 116 may be adhesive materials having good workability, bond strength, and transmittance. In the present embodiment, the first glue 112 and the second glue 116 may be, for example, a silane-based compound, an optically clear adhesive, an ultraviolet (UV) adhesive, a glass frit, a thermal curable adhesive, or a combination thereof. In the present embodiment, the first glue 112 and the second glue 116 can be disposed on the driving substrate 102 using dispensing, but the present disclosure is not limited to. In the present embodiment, the first glue 112 and the second glue 116 are formed of the same material, but the present disclosure is not limited to. In other embodiments, the first glue 112 and the second glue 116 can be formed of different materials depending on the realistic conditions.

In one embodiment, the front protective layer 100 has a first edge E1, a second edge E2, and a third edge E3 defining the notch R. The second edge E2 and the third edge E3 adjoin two ends of the first edge E1. The first gap G has a first portion Ga between the first edge E1 and the circuit board 106. In the present embodiment, a top view of the notch R of the front protective layer 100 is substantially U-shaped. In one embodiment, a distance S1 of the first portion Ga of the first gap G is in a range from 0.01 cm to 0.1 cm. The first glue 112 includes a main body portion 113 and extension portions 112a, 112b, 112c extending from three edges of the main body portion 113, respectively. The extension portions 112a, 112b, 112c extend from the first edge E1, the second edge E2, or the third edge E3 of the front protective layer 100 to cover the top surface of the front protective layer 100. In particular, the extension portion 112a extends from the first edge E1 of the front protective layer 100 to cover the top surface of the front protective layer. For example, a length L1 of the extension portion 112a extending from the first edge E1 to cover the front protective layer 100 is in a range from 0.05 cm to 0.15 cm. Therefore, ambient moisture can be prevented from entering the first portion Ga of the first gap G from the first edge E1 of the front protective layer 100.

The first gap G has a second portion Gb between the second edge E2 and the circuit board 106. In an embodiment, a distance S2 of the second portion Gb of the first gap G is in a range from 0.01 cm to 0.1 cm. The extension portion 112b extends from the second edge E2 of the front protective layer 100 to cover the top surface of the front protective layer 100. For example, a length L2 of the extension portion 112b extending from the second edge E2 to cover the top surface of the front protective layer 100 is in a range from 0.05 cm to 0.15 cm. Therefore, ambient moisture can be prevented from entering the second portion Gb of the first gap G from the second edge E2 of the front protective layer 100.

The first gap G has a third portion Gc between the third edge E3 and the circuit board 106. In an embodiment, a distance S3 of the third portion Gc of the first gap G is in a range from 0.01 cm to 0.1 cm. The extension portion 112c extends from the third edge E3 of the front protective layer 100 to cover the top surface of the front protective layer 100. For example, a length L3 of the extension portion 112c extending from the third edge E3 to cover the top surface of the front protective layer 100 is in a range from 0.05 cm to 0.15 cm. Therefore, ambient moisture can be prevented from entering the third portion Gc of the first gap G from the third edge E3 of the front protective layer 100. In the present embodiment, a top view of an entirety of the extension portions 112a, 112b, 112c of the first glue 112 is substantially U-shaped. Therefore, ambient moisture can be prevented from entering the first gap G from the first edge E1, the second edge E2, and the third edge E3 of the front protective layer 100.

As shown in FIG. 5, the main body portion 113 is on a top surface of the circuit board. In other words, the circuit board 106 is between the main body portion 113 and the driving substrate 102. Ambient moisture can be prevented from entering the first gap G from the printed circuit board 106 toward the first edge E1, the second edge E2, and the third edge E3 of the front protective layer 100. A thickness T of the main body portion 113 along a direction perpendicular to the top surface of the circuit board 106 is thick enough to ensure that ambient moisture can be prevented from entering the first gap G (e.g., the first portion Ga of the first gap G) from the circuit board 106. In one embodiment, the thickness T of the main body portion 113 along a direction perpendicular to the top surface of the circuit board 106 is in a range from 0.02 cm to 0.05 cm. The extension portions 112a, 112b, 112c cover the top surface of the front protective layer 100. In other words, the first edge E1, the second edge E2, and the third edge E3 of the front protective layer 100 are covered by the extension portions 112a, 112b, 112c of the first glue 112, respectively. Therefore, ambient moisture can be prevented from entering the first gap G from the front protective layer 100 toward the circuit board 106.

Figure 6:
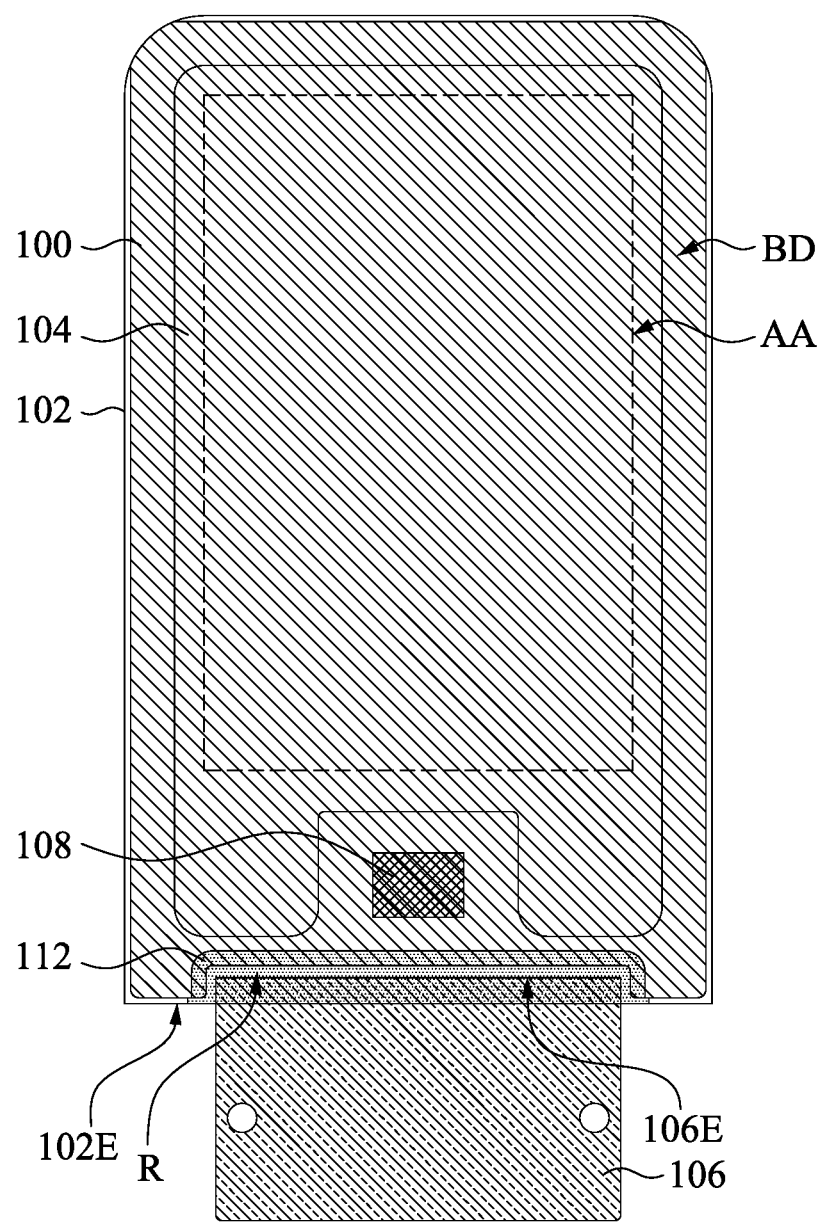
FIG. 6 is a top view of the display device according to another embodiment of this disclosure.

FIG. 6 is a top view of the display device according to another embodiment of this disclosure. Reference is made to FIG. 6. A main difference between the display device 10a in FIG. 6 and the display device 10 in FIG. 3 is that: the display device 10a does not have the opening O. The front protective layer 100 covers the chip 108. In other words, a normal projection of the front protective layer 100 on the driving substrate 102 overlaps a normal projection of the chip 108 on the driving substrate 102. Ambient moisture can be prevented from having disadvantageous effects on the chip 108 effectively.

Based on the above discussion, in the display device according to the embodiments of the disclosure, the end of the circuit board is in the notch of the front protective layer. The end of the circuit board and the front protective layer have a first gap therebetween. The glue fills in the first gap. The normal projection of the glue on the driving substrate overlaps the normal projection of the circuit board on the driving substrate and overlaps the normal projection of the front protective layer on the driving substrate. Therefore, ambient moisture can be prevented from entering the first gap on the driving substrate between the circuit board and the front protective layer.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A display device, comprising:
a driving substrate;
a front panel laminate disposed on the driving substrate and comprising a display medium layer;
a circuit board disposed on an end of the driving substrate;
a front protective layer disposed on the front panel laminate, wherein the front protective layer has a notch, an end of the circuit board is in the notch, and the end of the circuit board and the front protective layer have a first gap therebetween, the front protective layer has a first edge, a second edge, and a third edge defining the notch, the second edge and the third edge adjoin two ends of the first edge, the first gap has a first portion between the first edge and the circuit board and a second portion that is between the second edge and the circuit board, and the first portion of the first gap is in a range from 0.01 cm to 0.1 cm and the second portion of the first gap is in a range from 0.01 cm to 0.1 cm; and a glue filled in the first gap, wherein a normal projection of the glue on the driving substrate overlaps a normal projection of the circuit board on the driving substrate and overlaps a normal projection of the front protective layer on the driving substrate.

2. The display device of claim 1, wherein the first gap has a third portion between the third edge and the circuit board, the third portion of the first gap is in a range from 0.01 cm to 0.1 cm.

3. The display device of claim 1, wherein the glue comprises an extension portion, and the extension portion extends from the first edge, the second edge, or the third edge of the front protective layer to cover a top surface of the front protective layer.

4. The display device of claim 3, wherein the front protective layer is between the extension portion of the glue and the driving substrate.

5. The display device of claim 1, wherein the normal projection of the circuit board on the driving substrate does not overlap the normal projection of the front protective layer on the driving substrate.

6. The display device of claim 1, wherein the glue comprises a main body portion, and the circuit board is between the main body portion and the driving substrate.

7. The display device of claim 1, wherein the glue is a UV curable adhesive, a thermal curable adhesive, or a combination thereof.

8. The display device of claim 1, further comprising:
a chip, wherein the front protective layer has an opening, the chip is disposed on the driving substrate exposed by the opening, the opening and the chip have a second gap therebetween, the glue fills in the second gap, and the opening and the notch are spaced apart.

9. The display device of claim 8, wherein the glue extends from a top surface of the front protective layer to partially cover the chip.

* * * * *